US012685084B2

(12) United States Patent     (10) Patent No.:   US 12,685,084 B2

Noked                     (45) Date of Patent:      Jul. 14, 2026

(54) DIELECTRIC SPECTROSCOPY TEMPERATURE MONITORING USING ELECTROSTATIC CHUCK

(71) Applicant: Applied Materials, Inc., Santa Clara, CA (US)

(72) Inventor: Ori Noked, Brookline, MA (US)

(73) Assignee: Applied Materials, Inc., Santa Clara, CA (US)

( * ) Notice: Subject to any disclaimer, the term of this patent is extended or adjusted under 35 U.S.C. 154(b) by 412 days.

(21) Appl. No.: 18/229,068

(22) Filed: Aug. 1, 2023

(65)         Prior Publication Data

US 2025/0046640 A1     Feb. 6, 2025

(51) Int. Cl.
     *H10P 72/72*        (2026.01)
     *H10P 72/00*        (2026.01)

(52) U.S. Cl.
     CPC ........ *H10P 72/722* (2026.01); *H10P 72/0602* (2026.01)

(58) Field of Classification Search
     CPC ...................... H01L 21/6833; H01L 21/67248
     See application file for complete search history.

(56)          References Cited

U.S. PATENT DOCUMENTS

| | | | | | |
|---|---|---|---|---|---|
| 4,979,134 | A | * | 12/1990 | Arima | ...................... G01J 5/532 |
| | | | | | 250/339.04 |
| 6,125,529 | A | * | 10/2000 | Rosen | ...................... C30B 29/22 |
| | | | | | 29/25.35 |
| 6,128,084 | A | * | 10/2000 | Nanbu | ................... G01N 21/21 |
| | | | | | 250/225 |
| 7,208,067 | B2 | * | 4/2007 | Mitrovic | ............. H10P 72/0602 |
| | | | | | 156/345.28 |
| 7,329,389 | B2 | * | 2/2008 | Horovitz | ................ G01N 27/16 |
| | | | | | 422/50 |
| 2002/0041619 | A1 | * | 4/2002 | Merzliakov | ........ G01N 25/4866 |
| | | | | | 374/44 |

(Continued)

OTHER PUBLICATIONS

International Search Report and Written Opinion for International Application No. PCT/US2024/040061, dated Nov. 6, 2024, 11 pages.

(Continued)

*Primary Examiner* — Laura Martin
*Assistant Examiner* — Philip L Cotey
(74) *Attorney, Agent, or Firm* — KDW Firm PLLC

(57)         ABSTRACT

A method and a system for determining a temperature of a substrate using a dielectric spectroscopy system. One or more impedance signals are received, where the impedance signals are generated by the substrate and one or more components of the dielectric spectroscopy system in response to one or more measurement signals. At least one first impedance signal is associated with one or more impedance signals generated by the substrate. At least one second impedance signal is associated with one or more impedance signals generated by one or more components of the dielectric spectroscopy system. A temperature of the substrate is determined based on at least one of: at least one first impedance signal, and/or at least one second impedance signal. Receiving, associating, and determining are performed during at least one of the following: before, during and after performing at least one process on the substrate.

20 Claims, 7 Drawing Sheets

(56) References Cited

U.S. PATENT DOCUMENTS

| | | | | |
|---|---|---|---|---|
| 2003/0026060 A1* | 2/2003 | Hiramatsu | .......... | H10P 72/0434 |
| | | | | 361/311 |
| 2004/0188021 A1* | 9/2004 | Mitrovic | ............ | H10P 72/0602 |
| | | | | 156/345.52 |
| 2010/0000970 A1* | 1/2010 | Koshimizu | ....... | H01J 37/32642 |
| | | | | 156/345.48 |
| 2012/0200304 A1* | 8/2012 | Saha | ...................... | G01B 7/105 |
| | | | | 165/185 |
| 2019/0066984 A1* | 2/2019 | Mungekar | ......... | H01J 37/32724 |
| 2019/0228997 A1* | 7/2019 | Hu | ...................... | H10P 72/0436 |
| 2020/0378832 A1* | 12/2020 | Wilson | ................. | G01J 5/0007 |
| 2022/0158263 A1* | 5/2022 | Schmidt | ............... | G01N 27/301 |
| 2022/0415694 A1* | 12/2022 | Aguilar Santillan | ....................... | |
| | | | | H10P 72/0432 |

OTHER PUBLICATIONS

Chen et al., "Temperature Dependent Dielectric Properties of Polycrystalline Aluminum Oxide Substrates with Various Impurities," 8th International Conference on Electronic Packaging Technology, 6 pages, (2007)—Abstract.
Zhang et al., "Surface layer and its effect on dielectric properties of SiC ceramics," Journal of Alloys and Compounds, vol. 734: 16-21 (2018)—Abstract.
Zhu et al., "Point-defect-induced colossal dielectric behavior in GaAs single crystals," Royal Society of Chemistry Advances, vol. 7: 26130-26135 (2017).

* cited by examiner

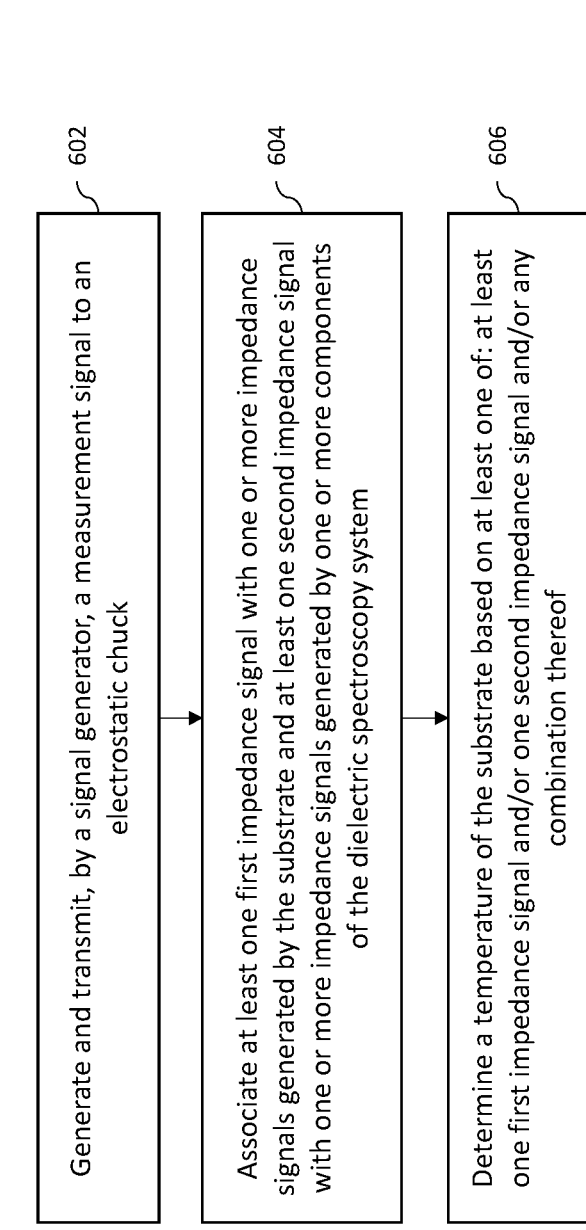

600

602

Generate and transmit, by a signal generator, a measurement signal to an electrostatic chuck

604

Associate at least one first impedance signal with one or more impedance signals generated by the substrate and at least one second impedance signal with one or more impedance signals generated by one or more components of the dielectric spectroscopy system

606

Determine a temperature of the substrate based on at least one of: at least one first impedance signal and/or one second impedance signal and/or any combination thereof

FIG. 6.

DIELECTRIC SPECTROSCOPY TEMPERATURE MONITORING USING ELECTROSTATIC CHUCK

TECHNICAL FIELD

This disclosure relates generally to substrate processing, and in particular, to improved electrostatic chucks for substrate processing, and more particularly, to monitoring of temperatures using electrostatic chucks using dielectric spectroscopy.

BACKGROUND

Modern substrate processing for applications such as manufacturing semiconductor devices, solar cell manufacturing, electronic component manufacturing, sensor fabrication, and micro-electromechanical device manufacturing, among others often entails an apparatus ("tool") that employ electrostatic holders or "chucks" to hold a substrate during processing. Examples of such apparatus include chemical vapor deposition (CVD) tools, physical vapor deposition (PVD) tools, substrate etching tools such as reactive ion etching (RIE) equipment, ion implantation systems, and other apparatus. In each of these apparatuses it may be desirable to heat a substrate to an elevated temperature or monitor whether and by how much a substrate is warming up during a process. In some cases, in order to heat a substrate to elevated temperatures, in addition to the electrostatic chuck (ESC) apparatus, a platen includes a heater adjacent to and/or embedded in an insulating material forming the body of the platen. The heater can be designed to apply heat to the back (back side) of the substrate (e.g., a wafer).

During substrate processing, it is important to monitor temperature of the substrate while it is positioned on the platen and, especially, during implantation (e.g., ion implantation). Failure to maintain proper temperature can result in defects, non-uniformity in the substrate, inconsistency between substrates, lower performance and yield, and other undesirable consequences. Some conventional systems typically employ contact temperature measurement to determine temperature of the substrate. However, because substrates are typically processed in vacuum conditions, this method is usually unreliable. Other systems use thermal imaging, which determines temperature of the substrate based on acquired thermal images. However, thermal imaging-based temperature measurement is limited to times when substrate is not being processed (e.g., beam-off times), making it likewise a less reliable proxy measurement. Another challenge facing thermal imaging is the complex and changing emissivity of the top layer of the substrate being measured. Without thorough calibration, per each substrate, and before every process, the thermal imaging cannot provide accurate and reliable temperature reading.

SUMMARY

In some implementations, the current subject matter relates to a method for determining a temperature of a substrate using a dielectric spectroscopy system. The method may include receiving, using at least one processor, one or more impedance signals. The impedance signals may be generated by the substrate and one or more components of the dielectric spectroscopy system in response to one or more measurement signals. The method may also include associating, based on at least one of: one or more frequencies, one or more amplitudes, one or more phases, and any combination thereof, of the received one or more impedance signals, at least one first impedance signal with one or more impedance signals generated by the substrate and at least one second impedance signal with one or more impedance signals generated by the one or more components of the dielectric spectroscopy system. The method may further include determining a temperature of the substrate based on the at least one first impedance signal. The receiving, the associating, and the determining may be performed during at least one of the following: before, during and after performing at least one process on the substrate.

In some implementations, the current subject matter may include one or more of the following optional features. One or more components of the dielectric spectroscopy system may include an electrostatic chuck system having a platen configured to hold the substrate in a predetermined position during the at least one process using an electrostatic clamping force. One or more measurement signals may be generated and transmitted to the electrostatic chuck system by at least one signal generator. At least one signal generator may be communicatively and/or electrically coupled to the electrostatic chuck system.

In some implementations, one or more measurement signals having at least one of: an amplitude, a frequency, a phase, and any combination thereof being different from respective at least one of: an amplitude, a frequency, a phase, and any combination thereof, of one or more electrical signals being supplied to the electrostatic chuck system by one or more electrical sources during the at least one process.

In some implementations, one or more impedance signals may be received from at least one impedance analyzer communicatively and/or electrically coupled to the electrostatic chuck system.

In some implementations, at least one second impedance signal may be generated by the platen in response to the one or more measurement signals. The associating may include correlating at least one second impedance signal with one or more stored impedance signals. The stored impedance signals may be stored in a storage location communicatively coupled with at least one processor.

In some implementations, one or more measurement signals may include at least one of the following: a single measurement signal generated at a predetermined time, a plurality of separate measurement signals generated at at least one predetermined time, a plurality of continuous measurement signals generated during the at least one process, and any combination thereof.

In some implementations, one or more measurement signals may have a frequency between 1 Hz and 100 MHz. Alternatively, or in addition, one or more measurement signals may have the frequency between 1 KHz and 1 MHz.

In some implementations, at least one process may include at least one of the following: an ion implantation, a chemical vapor deposition, physical vapor deposition, a substrate etching, a reactive ion etching, and any combination thereof.

In some implementations, the current subject matter relates to a system for determining a temperature of a substrate using a dielectric spectroscopy system. The system may include at least one processor and at least one non-transitory storage media storing instructions, that when executed by at least one processor, cause at least one processor to perform one or more of the following operations including receiving one or more impedance signals. The impedance signals may be generated by a substrate positioned in a dielectric spectroscopy system and one or more components of the dielectric spectroscopy system in response to one or more measurement signals. The operations may also include associating, based on at least one of: one or more frequencies, one or more amplitudes, one or more phases, and any combination thereof, of the received one or more impedance signals, at least one first impedance signal with one or more impedance signals generated by the substrate and at least one second impedance signal with one or more impedance signals generated by the one or more components of the dielectric spectroscopy system. The operations may further include determining a temperature of the substrate based on at least one first impedance signal. The receiving, the associating, and the determining may be performed during at least one of the following: before, during and after performing at least one process on the substrate.

In some implementations, in the above system, one or more components of the dielectric system may include an electrostatic chuck system having a platen configured to hold the substrate in a predetermined position during the at least one process using an electrostatic clamping force. One or more measurement signals may be generated and transmitted to the electrostatic chuck system by at least one signal generator communicatively and/or electrically coupled to the electrostatic chuck system. One or more measurement signals may have at least one of: an amplitude, a frequency, a phase, and any combination thereof, being different from respective at least one of: an amplitude, a frequency, a phase, and any combination thereof, of one or more electrical signals being supplied to the electrostatic chuck system by one or more electrical sources during at least one process.

Further, in some implementations, one or more impedance signals may be received from at least one impedance analyzer communicatively and/or electrically coupled to the electrostatic chuck system. At least one second impedance signal may be generated by the platen in response to one or more measurement signals. The associating may include correlating the at least one second impedance signal with one or more stored impedance signals, the one or more stored impedance signals being stored in a storage location communicatively coupled with the at least one processor. One or more measurement signals may include at least one of the following: a single measurement signal generated at a predetermined time, a plurality of separate measurement signals generated at at least one predetermined time, a plurality of continuous measurement signals generated during the at least one process, and any combination thereof. One or more measurement signals may have a frequency between 1 Hz and 100 MHz.

In some implementations, the current subject matter relates to a dielectric spectroscopy system. The system may include at least one signal generator being configured to generate and transmit one or more measurement signals, an electrostatic chuck communicatively and/or electrically coupled to the at least one signal generator and at least one power source. The power source may provide electrical power to the electrostatic chuck. The electrostatic chuck may include at least one or more electrodes. Upon receiving one or more electrical signals from at least one power source, an electrostatic clamping force may be generated to electrostatically retain at least one substrate over at least one platen during one or more processes performed on at least one substrate by the system. At least one substrate and at least one electrostatic chuck may receive one or more measurement signals. The system may also include at least one impedance analyzer communicatively and/or electrically coupled to the electrostatic chuck. The impedance analyzer may be configured to receive one or more impedance signals from at least one of: the at least one substrate and the at least one platen in response to receiving the one or more measurement signals. The system may further include at least one processing component configured for processing one or more impedance signals, and determining temperature of at least one of: at least one substrate, at least one platen, and a combination thereof.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. The drawings are schematic in nature and do not represent actual dimensions or aspect ratios. In the drawings.

FIG. 6 illustrates an example process, according to some implementations of the current subject matter.

DETAILED DESCRIPTION

To address these and potentially other deficiencies of currently available solutions, one or more implementations of the current subject matter relate to methods, systems, articles of manufacture, and the like that can, among other possible advantages, provide an ability to perform substrate processing, and in particular, to the use of improved electrostatic chucks for substrate processing, and more particularly, to monitoring of temperatures using electrostatic chucks using dielectric spectroscopy.

In some implementations, the current subject matter relates to processing of a workpiece and/or substrate at elevated temperatures and determining/monitoring its temperature during such processing using dielectric spectroscopy systems. Elevated temperatures may refer to substrate temperatures that may generally be greater than about 50° Celsius (C). In some example, non-limiting implementations, substrates may be processed at temperatures that may exceed about 200° C. or greater. In some example, non-limiting implementations, substrates may be processed at temperatures that may exceed about 500° C. or greater. During operation, the current subject matter's electrostatic chucks may be capable of operating at elevated temperatures by heating a substrate while simultaneously holding it using an electrostatic force (e.g., maintaining a substrate in a desired position on a platen of the dielectric spectroscopy system that includes an ESC). The dielectric spectroscopy system may hold a substrate using an electrostatic force generated by the ESC and/or with minimal physical contact between the ESC and substrate. Non-limiting examples of dielectric spectroscopy systems employing heated electrostatic chucks may include, but not limited to, chemical vapor deposition (CVD) tools, physical vapor deposition (PVD) tools, substrate etching tools such as reactive ion etching (RIE) equipment, ion implantation systems, and any other apparatuses/systems and/or any combinations thereof.

It should be noted that, as used herein, the terms "on," "overlying," "disposed on" and/or "over" may be used to indicate that two or more elements may be in direct physical contact with each other and/or are not in direct contact with each other. For example, "over" may mean that one element may be positioned above another element but not contact each other, and may have another element and/or elements positioned between these two elements. As such, the terms "on," "overlying," "disposed on" and "over" may be used interchangeably herewith.

Figure 1:
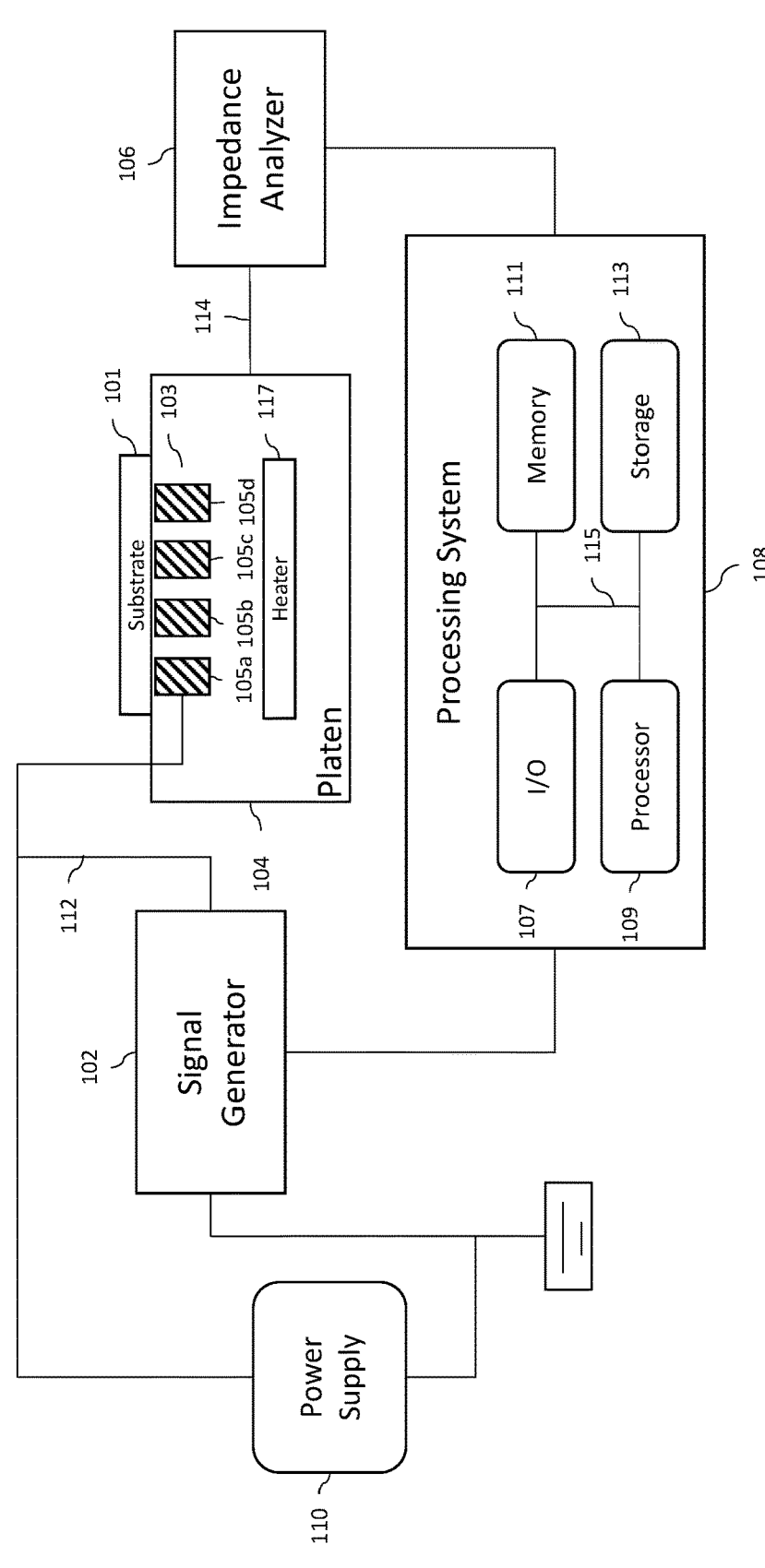
FIG. 1 illustrates an example dielectric spectroscopy system for determining and monitoring temperature of a substrate, according to some implementations of the current subject matter.

FIG. 1 illustrates an example dielectric spectroscopy system 100 that may be configured for monitoring temperature of a substrate, according to some implementations of the current subject matter. The system 100 may perform measurement and/or monitoring of temperature of a substrate 101 that may be held by a platen 104. In some instances, the system 100 may perform such measurement/monitoring of substrate temperature while the substrate is being worked on, e.g., during an ion implantation procedure. This is advantageous as the ion implantation process (and/or any other procedure) would not need to be interrupted to determine temperature of the substrate. Other conventional temperature measurement procedures (e.g., thermal imaging) typically do not measure temperature during ongoing processes. Further, as the ongoing processes can change the temperature of the substrate during application of the processes, the current subject matter allows accurate tracking of temperature variations in the substrate, which, conventional systems do not provide.

The system 100 may include a signal generator component 102, a platen 104 that may include a heater 117 and an electrostatic chuck system 103 having one or more electrodes 105 (a, b, c, d), an impedance analyzer component 106, a processing system 108, and a power supply 110. The signal generator 102 may be communicatively coupled (including, but not limited to, being connected) to the power supply 110 and the platen 104. The signal generator 102 may also (optionally) be configured to be communicatively, electrically, and/or otherwise communicatively coupled to the processing system 108 (and/or any other system and/or signal source). The power supply 110 may be configured to provide voltage to the electrostatic chuck system in the platen 104 so that it may generate an electrostatic clamping force to retain a substrate 101 on the platen 104. The electrostatic chuck system in the platen 104 may communicatively, electrically, and/or otherwise be coupled to the impedance analyzer 106. The impedance analyzer 106 may, in turn, communicatively, electrically, and/or otherwise be coupled to the processing system 108. As can be understood, the components 102-110 of the system 100 may be configured as separate components and/or one or more components 102-110 may be incorporated in, be integrated in, and/or be part of one or more of the other components 102-110.

Figure 2:
FIG. 2 is a block diagram of an ion implant system that may use an electrostatic chuck.
Figure 2:
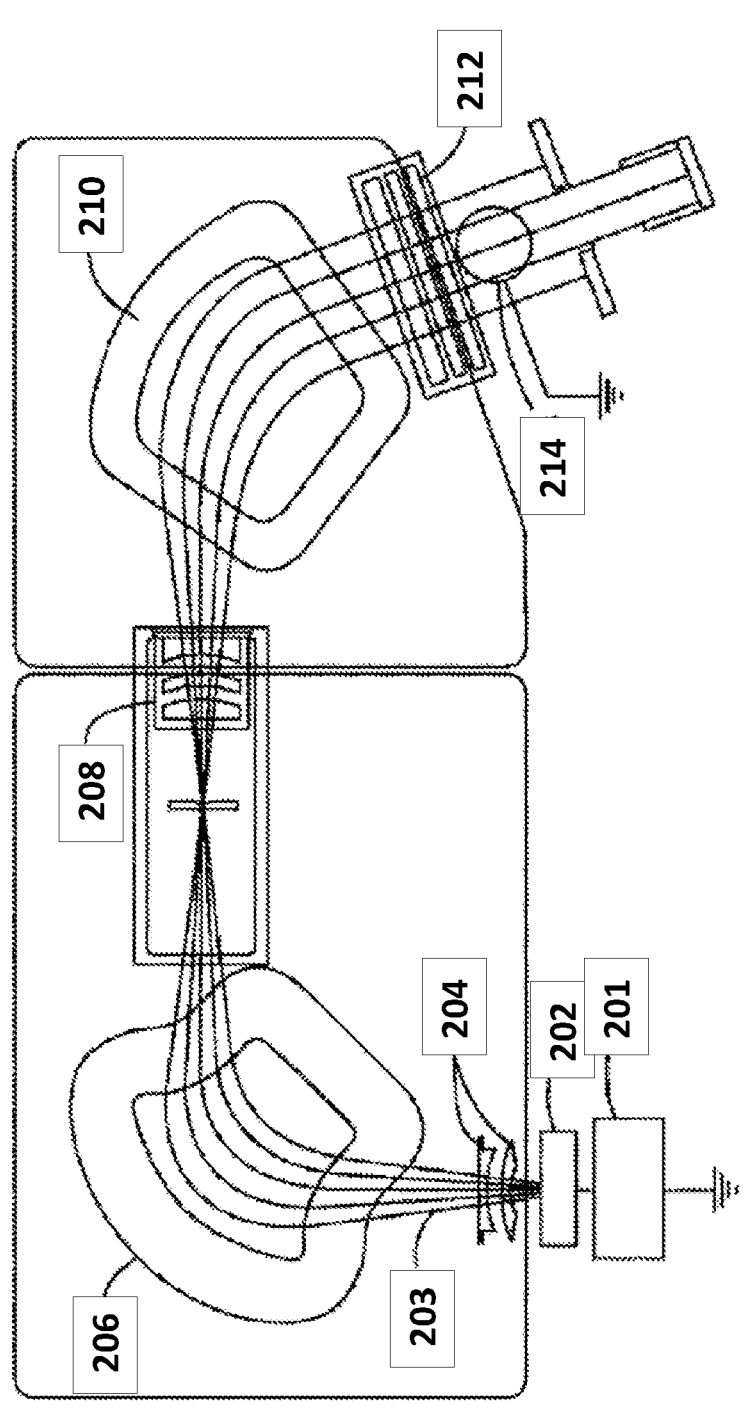

In some implementations, the system 100 may be incorporated into an ion implantation system. FIG. 2 is a block diagram of an example of an ion implantation system 200. The ion implantation system 200 may include a power supply 201, an ion source 202, one or more extraction electrodes 204, a mass analyzer magnet 206, a first deceleration stage (and/or an acceleration stage, etc.) 208, a corrector magnet 210, a second deceleration stage (and/or an energy purity module, etc.) 212, and a platen 214 (similar to platen 104 shown in FIG. 1).

The power supply 201 may be configured to supply energy to the ion source 202. The ion source 202 may be configured to generate ions of a particular species. The generated ions may be extracted from the source using one or more extraction electrodes 204. The extracted ions may be formed into a ion beam 203 which may be manipulated by one or more components 206-212 and directed onto a substrate that may be held by the platen 214.

In some implementations, after ion extraction, the ion beam 203 may be configured to pass through the mass analyzer magnet 206. The mass analyzer magnet 206 may be configured using a particular magnetic field, such that, for example, only ions having a desired mass-to-charge ratio are capable of passing through the mass analyzer magnet 206. Subsequent to the processing by the mass analyzer magnet 206, the ions (i.e., the ions having the desired mass-to-charge ratio) may pass through first deceleration stage 208 (to decelerate the ions) to the corrector magnet 210. The corrector magnet 210 may be energized to deflect ion beamlets in accordance with the strength and/or direction of the applied magnetic field in order to correct diverging ion beamlet paths into near parallel ion beamlet paths. In some implementations, the corrector magnet 210 may then provide an ion beam toward the substrate. The ion beam may be a ribbon beam as shown in FIG. 2 or a scanned spot beam (not illustrated), and/or proton and/or other beam profile having a corresponding apparatus.

In some non-limiting implementations, the second deceleration stage 212 may be disposed between the corrector magnet 210 and the platen 214 to further decelerate the ions. The processed ions may then be directed to the substrate, where they may be configured to lose energy upon colliding with the lattice of electrons and/or nuclei in the substrate. In some cases, a plasma flood gun may be provided to control charge accumulation on the substrate. The ions may come to rest at a desired depth within the substrate based on their acceleration energy, and/or any other parameters.

The platen 214 may include an electrostatic chuck. As discussed herein, the electrostatic chuck may use an attraction of opposite charges to hold and/or secure substrates during, for example, a fabrication processes performed.

Referring back to FIG. 1, the signal generator 102 may be configured to be any type of known signal generator that may generate and/or transmit measurement electrical signals 112, which may be added to (and/or, otherwise, combined with) the electrical signals that may be provided by the power supply 110. In some implementations, the combination of the two signals may be performed passively, such as, by way of a non-limiting example, by using resistors. As can be understood, any desired way of passively combining the signals may be used. Alternatively, or in addition, the combination of the two signals may be performed actively, such as, by way of a non-limiting example, by using operational amplifiers. As can be understood, any desired way of actively combining the signals may be used. The outcome of the combination may be a large clamping signal and/or a small measurement signal that may be riding on top of the large signal.

In some example, non-limiting implementations, the clamping electrical signal voltage may be on the order of hundreds of volts to thousands of volts. The measurement electrical signal voltage may, for example, be smaller than 1 volt. Alternatively, or in addition to, in some example, non-limiting implementations, the measurement electrical signal voltage may be on the order of volts to tens of volts.

The generated signals 112 may be transmitted to the platen 104. In some implementations, the signal generator 102 may be configured to generate (and transmit) such measurement signals 112 at different amplitudes and/or frequencies and/or phases than the respective amplitudes and/or frequencies and/or phases of electrical signals provided by the power supply 110. Use of different amplitudes/frequencies/phases may avoid interference between the power supply signals and the measurements signals. Signals 114 may be generated in response to the measurement signals 112. Electrical signals transmitted by the power supply 110 may be transmitted using a single wire. Alternatively, or in addition, the electrical signals transmitted by the power supply 110 may be transmitted using separate output wires, e.g., one per each electrode in the electrostatic chuck system.

The measurement signals may be used to measure a dielectric response of a medium between the electrodes 105 (a, b, c, d). Each material (e.g., material of the medium between electrodes, substrate material, and/or any other material) may have a unique dielectric response when signals having different frequencies are applied to it. Moreover, dielectric properties of each such material may change for different temperatures values. This means that the dielectric frequency response, or spectrum, for each material may change with different temperature. As such, by measuring dielectric frequency responses of the platen 104 and the substrate 101, it may be possible to independently correlate responses to application of heat at a particular temperature with high accuracy and reliability.

By way of a non-limiting example, the signal generator 102 may be configured to generate and transmit measurement signals 112 having a frequency in a range of 1 Hertz (Hz) to 100 MegaHertz (MHz), and more particularly, in a range of 1 KiloHertz (KHz) to 1 MHz. Moreover, in some implementations, the signal generator 102 may be configured to generate a single measurement signal having a predetermined frequency and/or amplitude and/or phase at a particular point in time. Alternatively, or in addition, the signal generator 102 may be configured to transmit multiple measurement signals 112 in a multiplexing fashion either at the same time and/or at different times. In yet further alternate/additional implementations, the signal generator 102 may be configured to continuously generate and transmit measurement signals 112 in a scanning fashion. Such scanning measurement signals 112 may be transmitted during a predetermined period of time and/or continuously during the time that the substrate 101 is being worked on (e.g., as part of ion implantation process, as discussed above) by the system 100. The heater 117 may be part of the platen 104 and may allow for operating the system 100 at elevated temperatures.

The electrostatic chuck system 103 may include the platen 104 and one or more electrodes 105 (a, b, c, d). Upon supply of the voltage from the power supply 110, the electrodes 105 may be configured to generate an electrostatic clamping force to retain the substrate 101 over the platen 104 in a predetermined position.

The electrodes 105 may be arranged in the platen 104 (and/or under an insulator layer (not shown in FIG. 1) in a co-planar fashion (as shown in FIG. 1), a planar (e.g., sandwiched) fashion, and/or any other desired fashion. In the co-planar arrangement, the measurements may be performed more laterally, as opposed to vertically when electrodes are arranged in the planar arrangement. In some implementations, co-planar arrangement of electrodes 105 may allow sampling of the bulk of the substrate 101 in its backside (which is less exposed to the process, e.g., ion implantation process), thereby providing a more consistent determination of temperatures of the substrate 101 during a manufacturing process. The co-planar arrangement of electrodes 105 may further allow for performing measurements/monitoring of temperature of the substrate 101 in a direction that is more uniform and/or potentially less sensitive to the ion implantation or other process operations.

The impedance analyzer 106 may be any type of known impedance analyzer that may be configured to measure complex electrical impedance as a function of test measurement signals (e.g., signals 112) that are being generated/transmitted by the signal generator 102 and passing through the electrodes 105, the rest of the platen 104, primarily the dielectric material near the electrodes 105, and the substrate 101. Impedance analyzer 106 may be configured to analyze frequency and/or amplitude and/or phase of the input signals from 112. Impedance signals 114, as determined and/or measured by the impedance analyzer 106, may be used to analyze dielectric behavior of the substrate 101 positioned on the platen 104. In some implementations, as stated above, the impedance analyzer 106 may be configured to receive signals 114 that may include impedance signals generated a single electrode and/or multiple electrodes 105 coupled separately in response to the signals 112. The frequency and/or amplitude and/or phase of the impedance signals 114 generated by the platen 104 may include known values (e.g., obtained during operation of the system 100 at different temperatures without a substrate). Knowledge of the frequency/amplitude/phase of the signals 114 generated by the platen 104 may be used by the impedance analyzer 106 (and/or the processing system 108) to distinguish the frequency/amplitude/phase of the signals 114 generated by the substrate 101. In some implementations, the impedance analysis and the signal generator may be part of a single system.

Once the frequency/amplitude/phase of the signals 114 that are responsive to the signals generated by the signal generator 102 are ascertained, they may be used to determine a dielectric spectrum (e.g., dielectric properties) of the substrate 101. The dielectric spectrum of the substrate 101 may then be correlated to the temperature of the substrate 101. The temperature of the substrate 101 may be determined using the processing system 108. As stated above, the processing system 108 may be a separate component of the system 100 and/or be incorporated and/or integrated into the impedance analyzer 106. The substrate temperature determination may be performed in response to a single test frequency signal generated by the signal generator 102. Alternatively, or in addition, the temperature may be determined in response to multiple test frequency signals generated by the signal generator 102. Yet, further, the temperature may be continuously determined in response to scanning test or measurement signal(s) generated by the signal generator 102.

Impedance measurements (as, for example, performed by the impedance analyzer 106 shown in FIG. 1) of a dielectric medium (e.g., a substrate, a platen, etc.), being subjected to electrical or other signals, provide data or information that can be analyzed in a context of equivalent circuits. Equivalent circuits typically provide a universal dielectric response that varies with frequency. As discussed herein, upon being subjected to a signal or signals, the medium generates an impedance response. Such impedance response includes a capacity portion that is used to determine permittivity, $\varepsilon^*$, of the medium. Permittivity is a measure of electric polarizability of the dielectric medium and is defined by:

$$\varepsilon^* = \varepsilon' - j\varepsilon'' \qquad (1)$$

where $j=\sqrt{-1}$, $\varepsilon'$ and $\varepsilon''$ are the real and imaginary parts of the complex permittivity $\varepsilon^*$, respectively.

Using equation (1), a dielectric loss tangent is defined as:

$$\tan\delta = \frac{\varepsilon'}{\varepsilon''}$$

and is used to quantify the dielectric's inherent dissipation of electromagnetic energy.

Further, as part of the determination of dielectric's impedance response, a relative real/absolute permittivity, $\varepsilon_r$, and free space permittivity, $\varepsilon_0$, are computed using:

$$\varepsilon_r(\omega) = \varepsilon'(\omega)/\varepsilon_0 = \varepsilon_r'(\omega) - j\varepsilon_r''(\omega) \qquad (2)$$

For a lossy dielectric medium, the relative permittivity can be determined using $$\varepsilon_\gamma = \varepsilon_r' - j\sigma/\omega\varepsilon_0 \qquad (3)$$

where $\sigma$ is a dielectric conductivity measured in siemens per meter (S/m), and $\omega=2\pi f$ is the angular frequency (where $f$ is the frequency of the supplied signal).

Further, during impedance response analysis, an inverse of the complex permittivity, also referred to as dielectric modulus, is calculated using:

$$M^* = 1/\varepsilon^* = M' + jM'' \qquad (4)$$

where M' and M" are the real and imaginary part of the dielectric modulus.

Figures 3A, 3B:
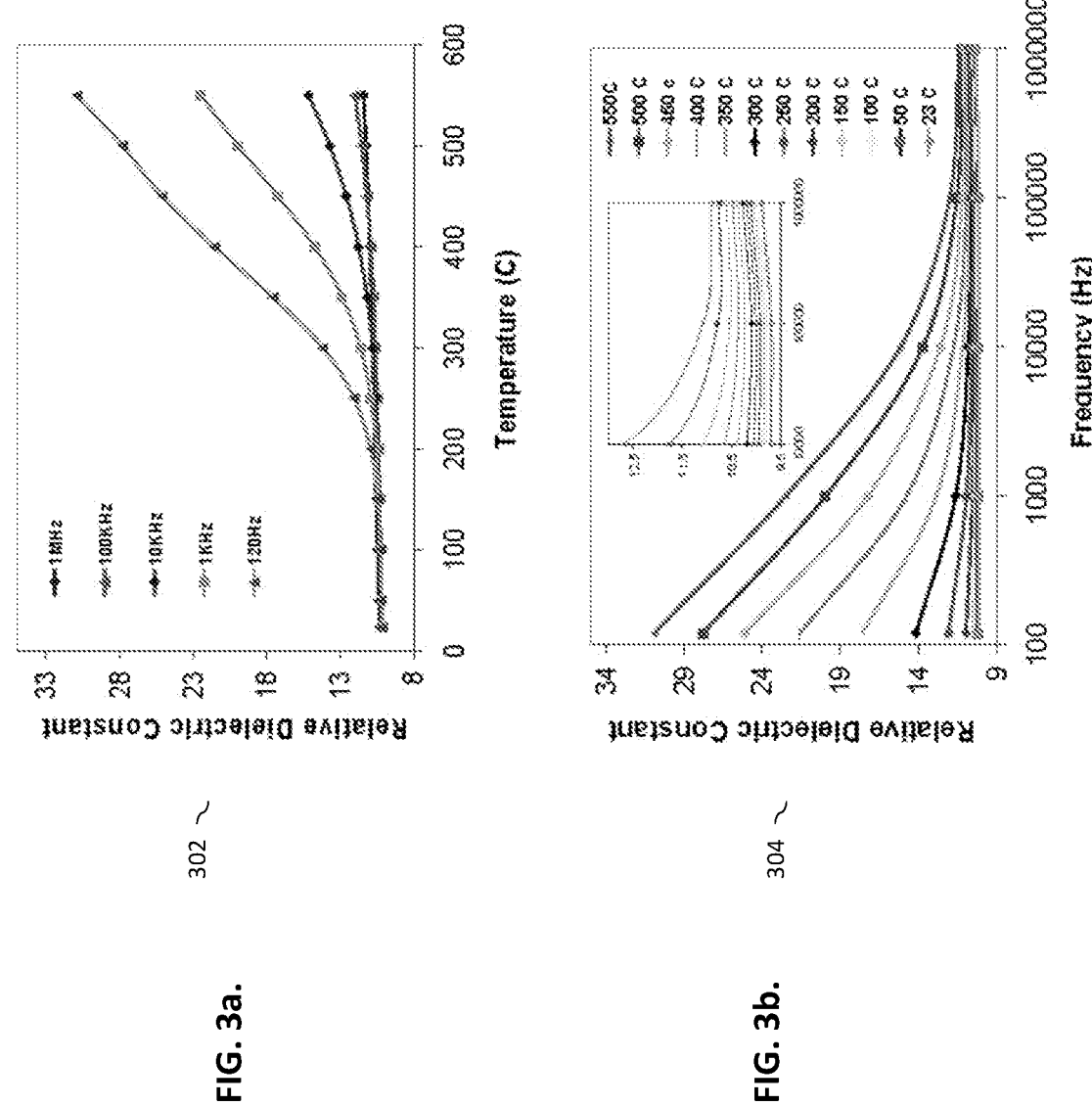
FIGS. 3a-d illustrate examples of dielectric spectroscopy analysis plots for a commonly used aluminum oxide ($Al_2O_3$) dielectric material.
Figures 3C, 3D:
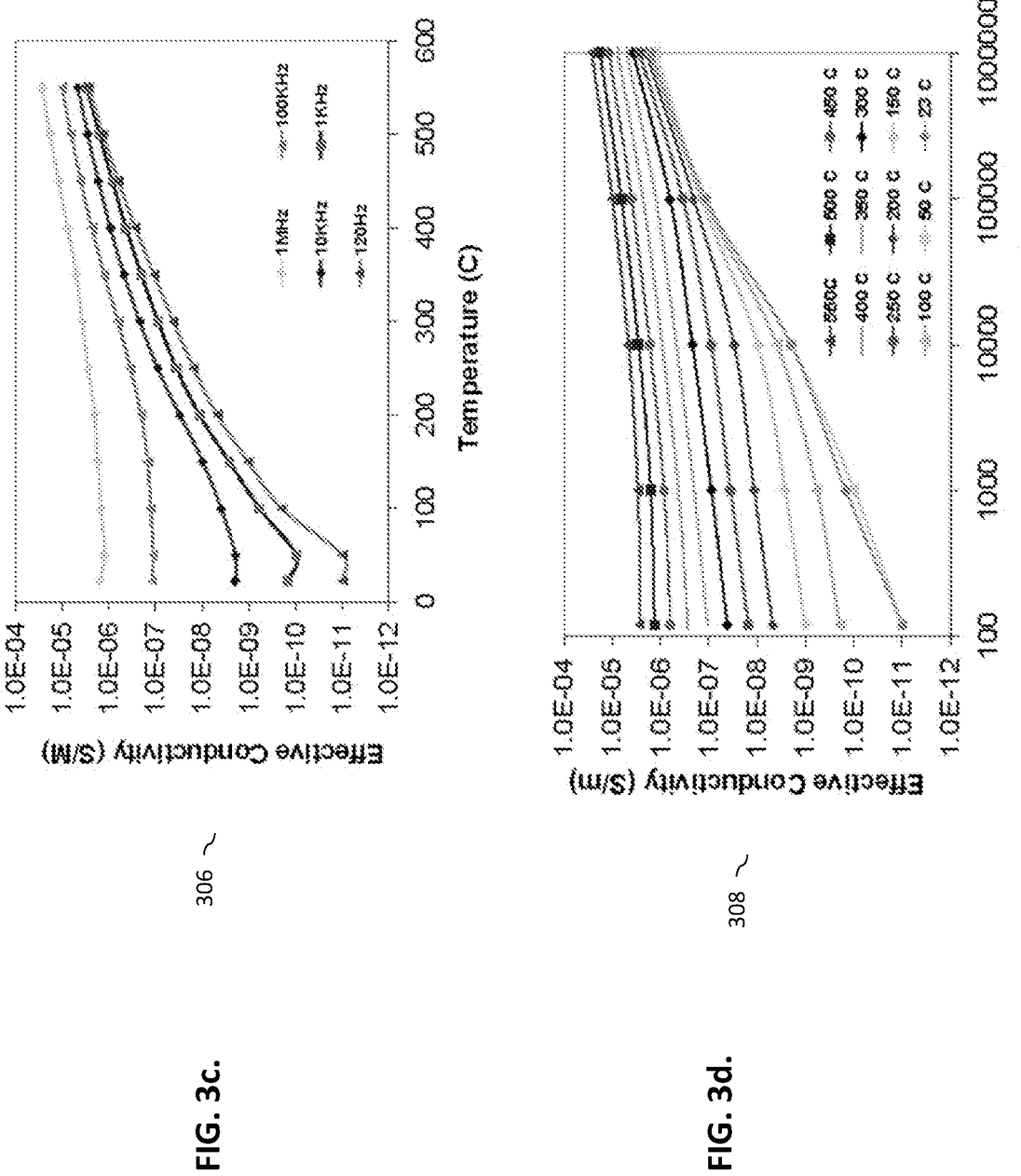

FIGS. 3*a-d* illustrate examples of dielectric spectroscopy analysis plots for a commonly used aluminum oxide ($Al_2O_3$) dielectric substrate and/or platen material, where dielectric responses were measured for a temperature range from 23° C. to 550° C., and for a frequency range from 120 Hz to 1 MHz (as available from L. -Y. Chen, "Temperature Dependent Dielectric Properties of Polycrystalline Aluminum Oxide Substrates with Various Impurities," 8th International Conference on Electronic Packaging Technology, Shanghai, China, 2007, pp. 1-6, doi: 10.1109/ICEPT.2007.4441460). In particular, FIG. 3*a* shows relative dielectric constant vs. temperature (in ° C.) plot 302; FIG. 3*b* shows relative dielectric constant vs. frequency (in Hz) plot 304; FIG. 3*c* shows effective conductivity (in S/m) vs. temperature (in ° C.) plot 306; and FIG. 3*d* shows effective conductivity (in S/m) vs. frequency (in Hz) plot 308.

As can be seen from FIGS. 3*a-d*, the aluminum oxide dielectric material exhibits different relative dielectric constant frequency response at different temperatures (see, e.g., FIG. 3*a*). For example, the relative dielectric constant of aluminum oxide is higher at higher temperatures and lower frequencies (e.g., at temperature of 500° C., and frequency of 120 Hz, the relative dielectric constant is approximately 28), whereas at higher frequencies and higher temperatures, it is lower (e.g., at temperature of 500° C., and frequency of 1 MHz, the relative dielectric constant is approximately 10). Moreover, by calculating an effective conductivity (as shown in FIGS. 3*c-d*), one can differentiate between different temperatures based on the frequency response.

Figures 4A, 4B:
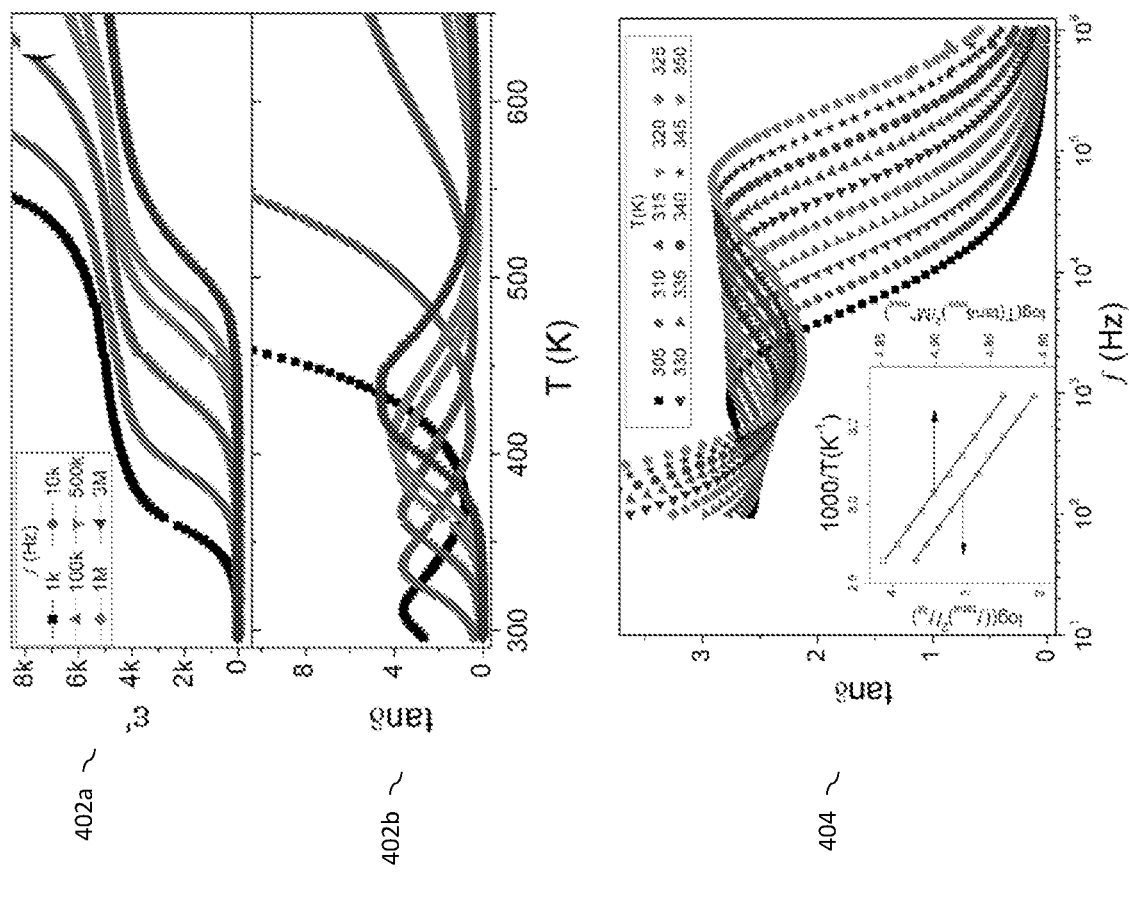
FIGS. 4a-b illustrate dielectric spectroscopy results for another commonly used dielectric material substrate—gallium arsenide (GaAs)

FIGS. 4*a-b* illustrate dielectric spectroscopy results for another commonly used dielectric substrate material—gallium arsenide (GaAs), where impedance responses were measured for temperature range from 300° K (Kelvin) to 600° K and in the frequency range from 1 KHz to 3 MHz (as available from M. Zhu et al., "Point-defect-induced colossal dielectric behavior in GaAs single crystals," Royal Society of Chemistry Advances (RSC Adv.), 2017, 7, 26130-26135; doi.org/10.1039/C7RA00058H). In particular, FIG. 4*a* illustrates plots 402*a* and 402*b* showing permittivity (as determined using equations (1)-(3) above) and dielectric loss tangent versus temperature (in ° K). FIG. 4*b* illustrates plot 404 showing dielectric loss tangent versus frequency (in Hz). The plots 402*a-b* and 404 illustrate temperature dependence of the dielectric constant and loss tangent and thus, provide another way to differentiate between dielectric impedance responses at different temperatures to different signal frequencies.

Figures 5A, 5B:
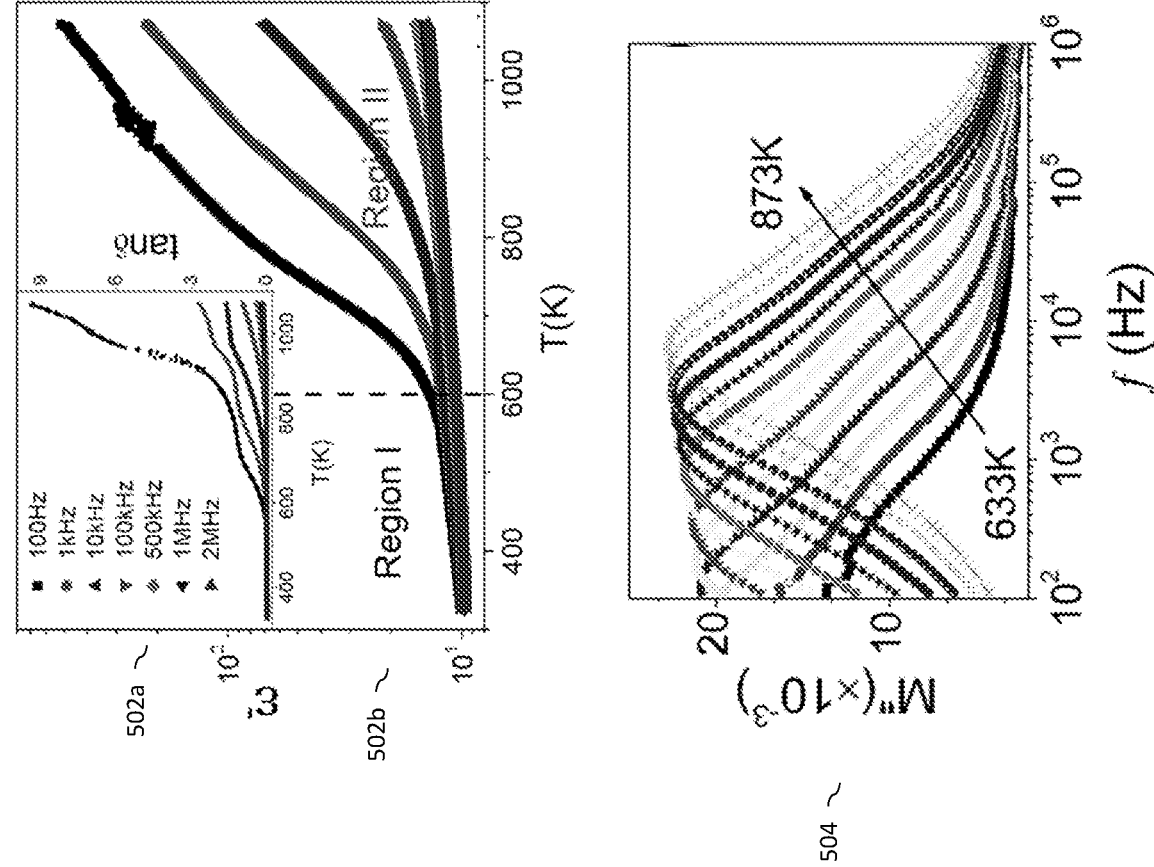
FIGS. 5a-b illustrate dielectric spectroscopy results for yet another commonly used dielectric material substrate—silicon-carbide (SiC)

FIGS. 5*a-b* illustrate dielectric spectroscopy results for yet another commonly used dielectric material—silicon-carbide (SiC), where impedance responses were measured for temperature range from 300° K to greater than 1000° K and in the frequency range from 1 KHz to 2 MHz (as available from J. Zhang et al., "Surface layer and its effect on dielectric properties of SiC ceramics," Journal of Alloys and Compounds, 734 (2018) 16-21; doi.org/10.1016/j.jallcom.2017.10.218). Specifically, FIG. 5*a* illustrates plot 502*a* showing the dielectric loss tangent versus temperature (in ° K) and plot 502*b* showing real permittivity versus temperature (in ° K). FIG. 5*b* illustrates plot 504 showing dielectric modulus (as determined using equation (4) above) versus frequency (in Hz). The plots 502*a-b* illustrate results for the temperature dependence of dielectric loss tangent (plot 502*a*) and real permittivity (plot 502*b*) show an ability to differentiate impedance responses for the above temperature and frequency ranges. Plot 504 complements the results in plots 502*a-b*, and presents it in a form of frequency dependence of the imaginary part of the dielectric modulus, thereby illustrating the ability to determine temperature based on the frequency response.

As can be understood, additional analysis of similar nature can be used to analyze temperature and/or frequency dependence on material's dielectric property(ies). These may include, but are not limited to, quality factor(s), dissipation factor(s), and/or any other factor(s), and/or any combination thereof.

As can be understood, the above dielectric response analysis may be performed for any type of dielectric materials that may include a platen and a substrate, respectively. Measuring different materials in parallel may provide more complex dielectric response (and/or spectrum), where different peaks may correspond to different materials. Further, separation(s) in such dielectric response (and/or spectrum) may be used to differentiate between different material contributions in the dielectric (e.g., composition of the dielectric material may be assessed using its dielectric responses). In particular, in some implementations, to establish a baseline dielectric response/spectrum, the current subject matter's processes may be performed on a platen without a substrate positioned on it. The baseline may be established for different frequencies and at different temperatures. Once the baseline dielectric response/spectrum for the platen alone is established, a substrate may be positioned on the platen and the current subject matter's processes may be repeated to determine a combined response/spectrum of the platen and substrate for the same set of frequencies and temperatures. Since the platen's response/spectrum has been previously determined, the dielectric response/spectrum of the substrate may be easily separated from the combined response/spectrum.

Referring back to FIG. 1, in some implementations, the processing system 108 may be used to trigger the signal generator component 102 to generate the measurement signal 112 that may be directed at the substrate 101 and/or the platen 104 for the purposes of measuring temperature of the substrate 101. This may allow for a time correlation between signals 112 generated by the signal generator and impedance signals 114 measured by the impedance analyzer, thereby providing a more precise temperature determination of the substrate 101. Alternatively, or in addition, the signal generator 102 may independently (of the processing system 108) generate signals 112 directed at the substrate 101 and/or the platen 104. It should be noted that generation of signals 112 by the signal generator 102 may be performed prior to, during, and/or subsequent to the substrate 101 being worked on (e.g., performing ion implantation, as for example, is shown in FIG. 1) by the system 100. This may allow for measurement of impedance signals 114 at different stages of the processes performed by the system 100 and more accurate determination of temperatures. When a DC signal or DC-like signal is supplied for the ESC clamping, a level of noise may be associated with the signal in general and as part of the clamping, especially as the dielectric becomes hotter and starts to leak (e.g., change its dielectric properties). By disconnecting the DC power to the electrode which runs the dielectric spectroscopy, the noise may be substantially reduced, allowing more accurate and reliable measurement.

In some implementations, the power supply 110 may be used to trigger the signal generator 102 to generate a measurement signal, while power may be shut off (and/or not provided) to one or more electrodes 105 (*a, b, c, d*). This may allow maintaining sufficient clamping power and still obtaining an accurate impedance measurement.

The processing system 108 may be configured to perform various computational tasks in determination of the temperature of the substrate 101 based on the received impedance signals 114.

The system 108 may include an input/output (I/O) device 107, a processor 109, a memory 111, and a storage 113. Each of the components 107-113 may be interconnected using a system bus 115. The processor 109 may be configured to process instructions for execution within the system 108. In some implementations, the processor 109 may be a single-threaded processor. Alternatively, or in addition, the processor 109 may be a multi-threaded processor. The processor 109 may be further configured to process instructions stored in the memory 111 and/or in the storage 113, including, but not limited to, receiving and/or sending information through the I/O device 107. The memory 111 may store information within the system 108. In some implementations, the memory 111 may be a computer-readable medium. Alternatively, or in addition, the memory 111 may be a volatile memory unit. In yet some implementations, the memory 111 may be a non-volatile memory unit. The storage 113 may be capable of providing mass storage for the system 108. In some implementations, the storage device 113 may be a computer-readable medium. Alternatively, or in addition, the storage 113 may be a floppy disk device, a hard disk device, an optical disk device, a tape device, non-volatile solid state memory, or any other type of storage device. The I/O device 107 may provide input/output operations for the system 108. In some implementations, the I/O device 107 may include a keyboard and/or pointing device. Alternatively, or in addition, the I/O device 107 may include a display unit for displaying graphical user interfaces.

In some example implementations, one or more components of the system 108 (and/or system 100) may include any combination of hardware and/or software. In some implementations, one or more components of the system 100 may be disposed on one or more computing devices, such as, server(s), database(s), personal computer(s), laptop(s), cellular telephone(s), smartphone(s), tablet computer(s), virtual reality devices, and/or any other computing devices and/or any combination thereof. In some example implementations, one or more components of the system 108 may be disposed on a single computing device and/or may be part of a single communications network. Alternatively, or in addition to, such services may be separately located from one another. A service may be a computing processor, a memory, a software functionality, a routine, a procedure, a call, and/or any combination thereof that may be configured to execute a particular function associated with the current subject matter lifecycle orchestration service(s).

In some implementations, the system 108's one or more components may include network-enabled computers. As referred to herein, a network-enabled computer may include, but is not limited to a computer device, or communications device including, e.g., a server, a network appliance, a personal computer, a workstation, a phone, a smartphone, a handheld PC, a personal digital assistant, a thin client, a fat client, an Internet browser, or other device. One or more components of the system 100 also may be mobile computing devices, for example, an iPhone, iPod, iPad from Apple® and/or any other suitable device running Apple's iOS® operating system, any device running Microsoft's Windows®. Mobile operating system, any device running Google's Android® operating system, and/or any other suitable mobile computing device, such as a smartphone, a tablet, or like wearable mobile device.

One or more components of the system 108 may include a processor and a memory, and it is understood that the processing circuitry may contain additional components, including processors, memories, error and parity/CRC checkers, data encoders, anti-collision algorithms, controllers, command decoders, security primitives and tamper-proofing hardware, as necessary to perform the functions described herein. One or more components of the system 108 may further include one or more displays and/or one or more input devices. The displays may be any type of devices for presenting visual information such as a computer monitor, a flat panel display, and a mobile device screen, including liquid crystal displays, light-emitting diode displays, plasma panels, cathode ray tube displays, or other. The input devices may include any device for entering information into the user's device that is available and supported by the user's device, such as a touch-screen, keyboard, mouse, cursor-control device, touch-screen, microphone, digital camera, video recorder or camcorder. These devices may be used to enter information and interact with the software and other devices described herein.

In some example implementations, one or more components of the system 108 may execute one or more applications, such as software applications, that enable, for example, network communications with one or more components of system 108 and transmit and/or receive data.

One or more components of the system 108 may include and/or be in communication with one or more servers via one or more networks and may operate as a respective front-end to back-end pair with one or more servers. One or more components of the system 108 may transmit, for example, from a mobile device application (e.g., executing on one or more user devices, components, etc.), one or more requests to one or more servers. The requests may be associated with retrieving data from servers. The servers may receive the requests from the components of the system 108. Based on the requests, servers may be configured to retrieve the requested data from one or more databases. Based on receipt of the requested data from the databases, the servers may be configured to transmit the received data to one or more components of the system 108, where the received data may be responsive to one or more requests.

The system 108 may include and/or be communicatively coupled to one or more networks. In some implementations, networks may be one or more of a wireless network, a wired network or any combination of wireless network and wired network and may be configured to connect the components of the system 108 and/or the components of the system 108 to one or more servers. For example, the networks may include one or more of a fiber optics network, a passive optical network, a cable network, an Internet network, a satellite network, a wireless local area network (LAN), a metropolitan area network (MAN), a wide area network (WAN), a virtual local area network (VLAN), an extranet, an intranet, a Global System for Mobile Communication, a Personal Communication Service, a Personal Area Network, Wireless Application Protocol, Multimedia Messaging Service, Enhanced Messaging Service, Short Message Service, Time Division Multiplexing based systems, Code Division Multiple Access based systems, D-AMPS, Wi-Fi, Fixed Wireless Data, IEEE 802.11b, 802.15.1, 802.11n and 802.11g, Bluetooth, NFC, Radio Frequency Identification (RFID), Wi-Fi, and/or any other type of network and/or any combination thereof.

In addition, the networks may include, without limitation, telephone lines, fiber optics, IEEE Ethernet 802.3, a wide area network, a wireless personal area network, a LAN, or a global network such as the Internet. Further, the networks may support an Internet network, a wireless communication network, a cellular network, or the like, or any combination thereof. The networks may further include one network, or any number of the exemplary types of networks mentioned above, operating as a stand-alone network or in cooperation with each other. The networks may utilize one or more protocols of one or more network elements to which they are communicatively coupled. The networks may translate to or from other protocols to one or more protocols of network devices. The networks may include a plurality of interconnected networks, such as, for example, the Internet, a service provider's network, a cable television network, corporate networks, and home networks.

The system 108 may include and/or be communicatively coupled to one or more servers, which may include one or more processors that maybe coupled to memory. Servers may be configured as a central system, server or platform to control and call various data at different times to execute a plurality of workflow actions. Servers may be configured to connect to the one or more databases. Servers may be incorporated into and/or communicatively coupled to at least one of the components of the system 108.

In some implementations, the processing system 108 may be configured to execute one or more computation routines (similar to those, discussed above in connection with FIGS. 3*a*-5*b*) that receive data related to frequencies/amplitudes/phases of signal 114 generated by the substrate 101 and/or platen 104 in response to the signals 112 generated/transmitted by the signal generator 102. Based on the received data, the system 108 may be configured to determine temperature values for each received impedance signal 114. Once temperature values are determined, the system 108 may be configured to compare the determined temperature values to one or more stored temperature values (as stored in memory 111 and/or storage 113). The stored temperature values may be associated with temperature values of the platen 104 generated in response to the signals generated/transmitted by the signal generator 102. The comparison of the temperature values may allow the system 108 to determine which temperature values are associated with the platen 104 and the substrate 101. The system 108 may then output (e.g., using the I/O device 107) the temperature values associated with the substrate 101. The system 108 may also output platen 104's temperature values.

Alternatively, or in addition, instead of determining temperature values for all received impedance signals 114, the system 108 may be configured to compare values of frequencies/amplitudes/phases of the received impedance signals 114 and values of frequencies/amplitudes/phases of the impedance signals that may be stored in its memory 111 and/or storage 113. The stored values may be received by the system 108 prior to receiving the impedance signals 114. The stored values may be indicative of values for frequencies/amplitudes/phases of signals generated by the platen 104 in response to the signals 112 generated by the signal generator 102. Comparison of received and stored frequency/amplitude/phases values may allow the system 108 to distinguish between signals 114 generated by the substrate 101 and the platen 104. This may further permit system 108 to extract signals generated by the substrate 101, and/or signals generated by the platen 104, and determine temperature values for the extracted signals only. Once temperature values for the extracted signals are determined, the system

108 may likewise output those values (e.g., using a graphical user interface that may be part of the I/O device 107).

Alternatively, or in addition, the system 100 may be configured to determine and/or infer temperature of the substrate 101 using the values for frequencies/amplitudes/ phases of signals generated by the platen 104. For example, the system may obtain such values for the platen 104 prior to, during, and/or after application of one or more of the ion implantation processes and/or any other processes, and use such values to estimate the temperature of the substrate 101. This may be performed without directly determining values for frequencies/amplitudes/phases of signals generated by the substrate 101. Moreover, the temperature of the substrate 101 may be determined using any combination of values for frequencies/amplitudes/phases of signals generated by the platen 104, the substrate 101 and/or both (and/or any other components of the system 100).

The above temperature determination, whether based on a single signal, multiple signals, and/or scanning signals generated by the signal generator 102, may allow for a more accurate measurement and/or monitoring of substrate 101 temperature without interruption of ion implantation process (s) (and/or any other procedure or process being performed on the substrate 101). This is clearly advantageous as it allows accurate determination of a state of the substrate 101 using dielectric spectroscopy before, after and/or during different processes and, if necessary, adjustment of parameters of such processes.

In some implementations, the system 100 may be configured to execute one or more calibration procedures. These may be performed for the system 100, before and/or after specific process, and/or as desired. Calibration procedures may be executed using a range of temperatures to ascertain a response from the system 100. For example, one example calibration procedure may involve performing temperature measurements of the platen 104 and/or substrate 101 (e.g., a sample substrate which may or may not be similar to the substrate used during the actual dielectric spectroscopy measurement) while one or more components of the system 100 (e.g., the whole platen 104 and in particular the electrostatic chuck 105) is at an ambient temperature. Another temperature measurement may be performed while one or more components of the system 100 (e.g., again, the entire platen 104 and in particular the electrostatic chuck 103) is at an elevated temperature. Based on these measurements, temperature behavior of the dielectric materials may be determined. The procedure can continue to calibrate the entire relevant temperature range for the operation during different processes.

Yet another example calibration procedure may include performing dielectric spectroscopy measurements of the substrate 101 prior to process(es) and after completion of such process(es) to determine for changes in the dielectric spectrum, which correspond to changes in composition of the substrate. This may allow interpolation of data in the middle range of the process (i.e., between the beginning and the end of the processes), assuming a smooth and/or monotonous transitions in the dielectric properties of the substrate in the process.

Yet a further example of calibration procedure may include temperature measurement before, during and after one or more process(es). This calibration procedure may be useful in determining how temperature (and hence properties of the substrate) may be expected to change. In some implementations, the calibration procedures may be performed at different temperature ranges (e.g., ambient, elevated, etc.) to determine behavior of the substrate. Further, instead of heating the substrate from ambient temperature while on the platen, a preheat of the substrate and an already heated platen may be provided. This may reduce a risk of thermomechanical strain/damage/failure/etc. of the substrate.

FIG. 6 is a flow chart illustrating a process 600 for measuring temperature of a substrate using a dielectric spectroscopy system while a process is being applied to the substrate, according to some implementations of the current subject matter. The process 600 may be performed using one or more components 102-108 of the system 100 shown in FIG. 1.

At 602, a measurement signal may be generated by the signal generator 102, transmitted to and received by one or more components of the system 100, e.g., the electrostatic chuck system 103 (as shown in FIG. 1). In particular, as shown in FIG. 1, the measurement signal 112 may be transmitted by the signal generator 102 to the substrate 101 and/or the platen 104. Transmission of such measurement signals 112 may be performed while one or more processes (e.g., ion implantation as shown in FIG. 1) are being performed.

In some example, non-limiting implementations, the measurement signals may have a frequency between 1 Hz and 100 MHz. In further example, non-limiting implementations, the measurement signals may have the frequency between 1 KHz and 1 MHz. The measurement signals may include at least one of the following: a single measurement signal generated at a predetermined time, a plurality of separate measurement signals generated at at least one predetermined time, a plurality of continuous measurement signals generated during the at least one process, and any combination thereof.

Moreover, the measurement signals may have an amplitude and/or a frequency and/or a phase that may be different from an amplitude and/or a frequency and/or a phase, respectively, of one or more electrical signals that are supplied to the electrostatic chuck system 103 by one or more electrical sources 110 during one or more processes. In some implementations, such processes may include at least one of the following: an ion implantation, a chemical vapor deposition, physical vapor deposition, a substrate etching, a reactive ion etching, and any combination thereof.

At 604, at least one first impedance signal may be associated and/or correlated with one or more impedance signals generated by the substrate. Also, at least one second impedance signal may be associated and/or correlated with one or more impedance signals generated by one or more components (e.g., platen) of the dielectric spectroscopy system. The association/correlation may be performed based on at least one of: one or more frequencies and one or more amplitudes and one or more phases of the received impedance signals.

In some implementations, at stated above, the second impedance signal may be generated by the platen in response to one or more measurement signals. The association/correlation of impedance signals may include correlation of the second impedance signal with one or more stored impedance signals. The stored impedance signals may be stored in a storage location (e.g., memory 111 and/or storage 113).

At 606, the impedance signals may be provided to the processing system 108, which may determine a temperature of the substrate based on the first impedance signal (i.e., signal generated by the substrate 101, and/or based on the second impedance signal, and/or any combination thereof). In some implementations, the process 600 may be performed during and/or while at least one process is being performed on the substrate 101 by the system 100.

The various elements of the components as previously described with reference to FIGS. 1-6 may include various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an implementation is implemented using hardware elements and/or software elements may vary in accordance with any number of factors, such as desired computational rate, power levels, heat tolerances, dielectric materials used, processing cycle budget, input data rates, output data rates, memory resources, data bus speeds and other design or performance constraints, as desired for a given implementation.

One or more aspects of at least one implementation may be implemented by representative instructions stored on a machine-readable medium which represents various logic within the processor, which when read by a machine causes the machine to fabricate logic to perform the techniques described herein. Such representations, known as "IP cores", may be stored on a tangible, machine readable medium and supplied to various customers or manufacturing facilities to load into the fabrication machines that make the logic or processor. Some implementations may be implemented, for example, using a machine-readable medium or article which may store an instruction or a set of instructions that, if executed by a machine, may cause the machine to perform a method and/or operations in accordance with the implementations. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writable or rewritable media, digital or analog media, hard disk, floppy disk, Compact Disk Read Only Memory (CD-ROM), Compact Disk Recordable (CD-R), Compact Disk Rewritable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The components and features of the devices described above may be implemented using any combination of discrete circuitry, application specific integrated circuits (ASICs), logic gates and/or single chip architectures. Further, the features of the devices may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It will be appreciated that the exemplary devices shown in the block diagrams described above may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in implementations.

At least one computer-readable storage medium may include instructions that, when executed, cause a system to perform any of the computer-implemented methods described herein.

Some implementations may be described using the expression "one implementation" or "an implementation" along with their derivatives. These terms mean that a particular feature, structure, or characteristic described in connection with the implementation is included in at least one implementation. The appearances of the phrase "in one implementation" in various places in the specification are not necessarily all referring to the same implementation. Moreover, unless otherwise noted the features described above are recognized to be usable together in any combination. Thus, any features discussed separately may be employed in combination with each other unless it is noted that the features are incompatible with each other.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single implementation for the purpose of streamlining the disclosure. This method of disclosure is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separate implementation. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

The foregoing description of example implementations has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner and may generally include any set of one or more limitations as variously disclosed or otherwise demonstrated herein.

What is claimed:

1. A method for determining a temperature of a substrate using a dielectric spectroscopy system, comprising:

receiving, using at least one processor, one or more impedance signals, the one or more impedance signals being generated by the substrate and one or more components of the dielectric spectroscopy system in response to one or more measurement signals;

comparing, using the at least one processor, at least one of: one or more frequencies, one or more amplitudes, one or more phases, or any combination thereof, of the received one or more impedance signals to respective at least one of: one or more stored frequencies, one or more stored amplitudes, one or more stored phases, or any combination thereof, and associating, based on the comparing, at least one first impedance signal with one or more impedance signals generated by the substrate and at least one second impedance signal with one or more impedance signals generated by the one or more components of the dielectric spectroscopy system; and determining, using the at least one processor, a temperature of the substrate based on the at least one of: the at least one first impedance signal, the at least one second impedance signal, or any combination thereof;

wherein the receiving, the associating, and the determining is being performed during at least one of the following: before, during or after performing at least one process on the substrate.

2. The method according to claim 1, wherein the one or more components of the dielectric system include an electrostatic chuck system having a platen configured to hold the substrate in a predetermined position during the at least one process using an electrostatic clamping force.

3. The method according to claim 2, wherein the one or more measurement signals are generated and transmitted to the electrostatic chuck system by at least one signal generator.

4. The method according to claim 3, wherein the at least one signal generator being communicatively and/or electrically coupled to the electrostatic chuck system.

5. The method according to claim 2, wherein the one or more measurement signals having at least one of: an amplitude, a frequency, a phase, or any combination thereof being different from respective at least one of: an amplitude, a frequency, a phase, or any combination thereof, of one or more electrical signals being supplied to the electrostatic chuck system by one or more electrical sources during the at least one process.

6. The method according to claim 2, wherein the one or more impedance signals are received by at least one impedance analyzer communicatively and/or electrically coupled to the electrostatic chuck system.

7. The method according to claim 2, wherein the at least one second impedance signal being generated by the platen in response to the one or more measurement signals.

8. The method according to claim 7, wherein the associating includes correlating the at least one second impedance signal with one or more stored impedance signals, the one or more stored impedance signals being stored in a storage location communicatively coupled with the at least one processor.

9. The method according to claim 1, wherein the one or more measurement signals include at least one of the following: a single measurement signal generated at a predetermined time, a plurality of separate measurement signals generated at at least one predetermined time, a plurality of continuous measurement signals generated during the at least one process, or any combination thereof.

10. The method according to claim 1, wherein the one or more measurement signals have a frequency between 1 Hz and 100 MHz.

11. The method according to claim 10, wherein the one or more measurement signals have the frequency between 1 KHz and 1 MHz.

12. The method according to claim 1, wherein the at least one process includes at least one of the following: an ion implantation, a chemical vapor deposition, physical vapor deposition, a substrate etching, a reactive ion etching, or any combination thereof.

13. A system, comprising:

at least one processor; and at least one non-transitory storage media storing instructions, that when executed by the at least one processor, cause the at least one processor to perform operations including receiving one or more impedance signals, the one or more impedance signals being generated by a substrate positioned in a dielectric spectroscopy system and one or more components of the dielectric spectroscopy system in response to one or more measurement signals;

comparing, at least one of: one or more frequencies, one or more amplitudes, one or more phases, or any combination thereof, of the received one or more impedance signals to respective at least one of: one or more stored frequencies, one or more stored amplitudes, one or more stored phases, or any combination thereof, and associating, based on the comparing, at least one first impedance signal with one or more impedance signals generated by the substrate and at least one second impedance signal with one or more impedance signals generated by the one or more components of the dielectric spectroscopy system; and determining a temperature of the substrate based on at least one of: the at least one first impedance signal, the at least one second impedance signal, or any combination thereof;

wherein the receiving, the associating, and the determining is being performed during at least one of the following: before, during or after performing at least one process on the substrate.

14. The system according to claim 13, wherein the one or more components of the dielectric system include an electrostatic chuck system having a platen configured to hold the substrate in a predetermined position during the at least one process using an electrostatic clamping force;

the one or more measurement signals are generated and transmitted to the electrostatic chuck system by at least one signal generator communicatively and/or electrically coupled to the electrostatic chuck system.

15. The system according to claim 14, wherein the one or more measurement signals having at least one of: an amplitude, a frequency, a phase, or any combination thereof, being different from respective at least one of: an amplitude, a frequency, a phase, or any combination thereof, of one or more electrical signals being supplied to the electrostatic chuck system by one or more electrical sources during the at least one process.

16. The system according to claim 14, wherein the one or more impedance signals are received from at least one impedance analyzer communicatively and/or electrically coupled to the electrostatic chuck system.

17. The system according to claim 14, wherein the at least one second impedance signal being generated by the platen in response to the one or more measurement signals;

wherein the associating includes correlating the at least one second impedance signal with one or more stored impedance signals, the one or more stored impedance signals being stored in a storage location communicatively coupled with the at least one processor.

18. The system according to claim 14, wherein the one or more measurement signals include at least one of the following: a single measurement signal generated at a predetermined time, a plurality of separate measurement signals generated at at least one predetermined time, a plurality of continuous measurement signals generated during the at least one process, or any combination thereof.

19. The system according to claim 14, wherein the one or more measurement modulation signals have a frequency between 1 Hz and 100 MHz.

20. A dielectric spectroscopy system, comprising:

at least one signal generator being configured to generate and transmit one or more measurement signals;

an electrostatic chuck communicatively and/or electrically coupled to the at least one signal generator and at least one power source, the at least one power source providing electrical power to the electrostatic chuck, the electrostatic chuck including at least one or more electrodes, upon receiving one or more electrical signals from the at least one power source, generating an electrostatic clamping force to electrostatically retain at least one substrate over at least one platen during one or more processes performed on the at least one substrate by the system, the at least one substrate and the at least one electrostatic chuck receive the one or more measurement signals;

at least one impedance analyzer communicatively and/or electrically coupled to the electrostatic chuck, the at least one impedance analyzer being configured to receive one or more impedance signals from at least one of: the at least one substrate or the at least one platen in response to receiving the one or more measurement signals; and at least one processing component configured for processing the one or more impedance signals;

comparing at least one of: one or more frequencies, one or more amplitudes, one or more phases, or any combination thereof, of the received one or more impedance signals to respective at least one of: one or more stored frequencies, one or more stored amplitudes, one or more stored phases, or any combination thereof, and associating, based on the comparing, at least one first impedance signal with one or more impedance signals generated by the substrate and at least one second impedance signal with one or more impedance signals generated by the at least one platen; and determining, based on the associating, temperature of at least one of: the at least one substrate, the at least one platen, or a combination thereof.

* * * * *